US007339197B2

(12) United States Patent
Lin et al.

(10) Patent No.: US 7,339,197 B2
(45) Date of Patent: Mar. 4, 2008

(54) LIGHT EMITTING DIODE AND FABRICATION METHOD THEREOF

(75) Inventors: Chao-Ying Lin, Taipei (TW); Sun-Bin Yin, Hsinchu (TW); Sheng-Bang Huang, Changhua (TW); Pei-Fang Chiang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 176 days.

(21) Appl. No.: 11/042,116

(22) Filed: Jan. 26, 2005

(65) Prior Publication Data

US 2006/0054904 A1 Mar. 16, 2006

(30) Foreign Application Priority Data

Sep. 14, 2004 (TW) ............................... 93127740 A

(51) Int. Cl.
*H01L 33/00* (2006.01)
(52) U.S. Cl. .................... 257/95; 257/E33.067; 438/27
(58) Field of Classification Search .................. 257/95, 257/E33.067, E33.071, E33.074; 438/27, 438/28
See application file for complete search history.

(56) References Cited

U.S. PATENT DOCUMENTS

| 5,718,497 | A  | * | 2/1998  | Yokoyama et al. ......... 362/625 |
| 5,779,924 | A  | * | 7/1998  | Krames et al. ............... 216/24 |
| 2001/0019479 | A1 | * | 9/2001  | Nakabayashi et al. ........ 362/31 |
| 2002/0015193 | A1 | * | 2/2002  | Tabata ........................ 358/475 |
| 2002/0180351 | A1 | * | 12/2002 | McNulty et al. ............. 313/512 |
| 2002/0195609 | A1 | * | 12/2002 | Yoshitake et al. ............. 257/81 |
| 2004/0173808 | A1 | * | 9/2004  | Wu ............................. 257/99 |
| 2004/0218390 | A1 | * | 11/2004 | Holman et al. ............. 362/245 |
| 2004/0228124 | A1 | * | 11/2004 | Reiff et al. ................. 362/184 |
| 2005/0040405 | A1 | * | 2/2005  | Isokawa ...................... 257/79 |
| 2005/0226636 | A1 | * | 10/2005 | Hiramatsu et al. .......... 398/182 |
| 2005/0274967 | A1 | * | 12/2005 | Martin et al. ................. 257/98 |

* cited by examiner

*Primary Examiner*—Carl Whitehead, Jr.
*Assistant Examiner*—Jennifer M. Dolan
(74) *Attorney, Agent, or Firm*—Birch, Stewart, Kolasch & Birch, LLP

(57) ABSTRACT

A light emitting diode. The light emitting diode comprises a lead frame, a plurality of light emitting chips in the lead frame, and a molding unit in an optical path of the light emitting chips, wherein the molding unit comprises a periodic microstructure.

25 Claims, 16 Drawing Sheets
(8 of 16 Drawing Sheet(s) Filed in Color)

LIGHT EMITTING DIODE AND FABRICATION METHOD THEREOF

BACKGROUND

The invention relates to a light emitting diode (LED), and more particularly to a LED with molding unit and fabrication method thereof.

Multi-chip LEDs comprise a plurality of different color light emitting chips. The most common white multi-chip LED is a RGB LED. RGB LEDs comprise red (R), green (G) and blue (B) light emitting chips for obtaining white light.

FIG. 1 shows a bullet type RGB LED structure. Red light emitting chip R, green light emitting chip G and blue light emitting B are disposed in the lead frame 10. The sidewalls of lead frame 10 comprise a highly reflective layer with a curvature for condensing the light emitted from the light emitting chips R, G and B. This type of LED further comprises lens type molding unit 12 to improve directionality thereof. A RGB LED has a good color mixing, the one would not see different color at different viewing angle. The light emitting chips R, G and B are positioned in different positions in the lead frame 10, however, the color-mixing effect of the bullet type LED is reduced. The lens type molding unit 12 reduces the color-mixing effect.

FIG. 2 shows a surface-mount device (SMD) RGB LED structure. The SMD RGB LED has no lens type molding unit, so its directionality is worse than the bullet type RGB LED. Furthermore, the surface of the lead frame 20 of the SMD RGB LED is uneven, thus the color-mixing effect and color uniformity are improved. At the same time, the uneven surface reflects and even scatters light, both of which decrease the SMD RGB LED directionality. In short, the SMD RGB LED improves color-mixing but reduces directionality.

Thus, the bullet type LED has good directionality, but bad color-mixing; the SMD type LED has bad directionality, but good color-mixing. Hence, there is a need for a LED with good directionality and good color-mixing characteristics.

SUMMARY

Accordingly, embodiments of the invention provide a light emitting diode and fabrication method thereof.

A light emitting diode comprises a lead frame, a plurality of light emitting chips disposed in the lead frame, and a molding unit disposed in an optical path of the light emitting chips, wherein the molding unit comprises a periodic microstructure.

A light emitting diode fabrication method comprises providing a lead frame, providing a plurality of light emitting chips in the lead frame, patterning a surface of a molding unit to form a periodic microstructure, and setting the molding unit disposed in an optical path of the light emitting chips.

DESCRIPTION OF THE DRAWINGS

The patent or application file contains at least one drawing executed in color. Copies of this patent or patent application publication with color drawing(s) will be provided by the office upon request and payment of the necessary fee.

DETAILED DESCRIPTION

Figure 3A:
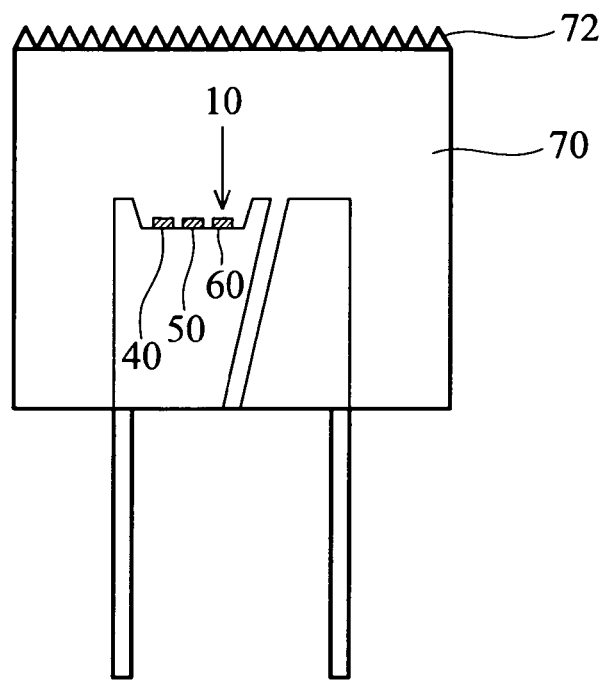
FIG. 3A is a cross-section illustrating a light emitting diode of the embodiments.
Figure 3B:
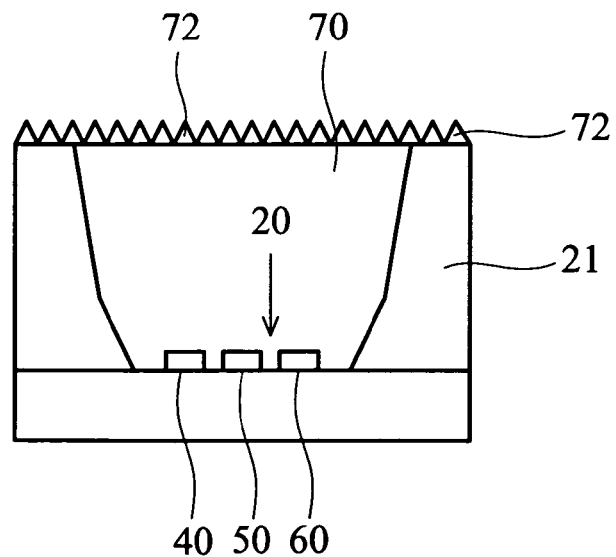
FIG. 3B is a cross-section illustrating another light emitting diode of the embodiments.

FIGS. 3A and 3B show multi-chip LEDs of the invention. The two LEDs comprise lead frame 10 (FIG. 3A) and lead frame 20 (FIG. 3B) respectively. The lead frame 10 comprises a smooth curved refractive surface to condense light. Two or more light emitting chips are disposed in the lead frame 10 and lead frame 20. In one embodiment, there are three light emitting chips 40, 50 and 60 in the lead frame 10 and lead frame 20 respectively. A main feature of the embodiment is the molding unit 70 with periodic microstructure 72.

Molding unit 70 is set in the optical path of the light emitting chips 40, 50 and 60 to condense light and mix color. The Molding unit 70 is transparent and the material thereof comprises epoxy or polymers. The polymers comprise polymethylmethacrylate (PMMA) or polycarbonate (PC). The molding unit 70 may be formed by a molding method. In this molding method, the melted epoxy or polymer mold is put in the mold, and the mold has a periodic microstructure. After solidification, the periodic microstructure of the mold is transferred to the epoxy or polymer molding unit 70 with periodic microstructure 72. The periodic microstructure of the mold may be formed by etching, cutting tools, laser or electron beam.

Figure 4A:
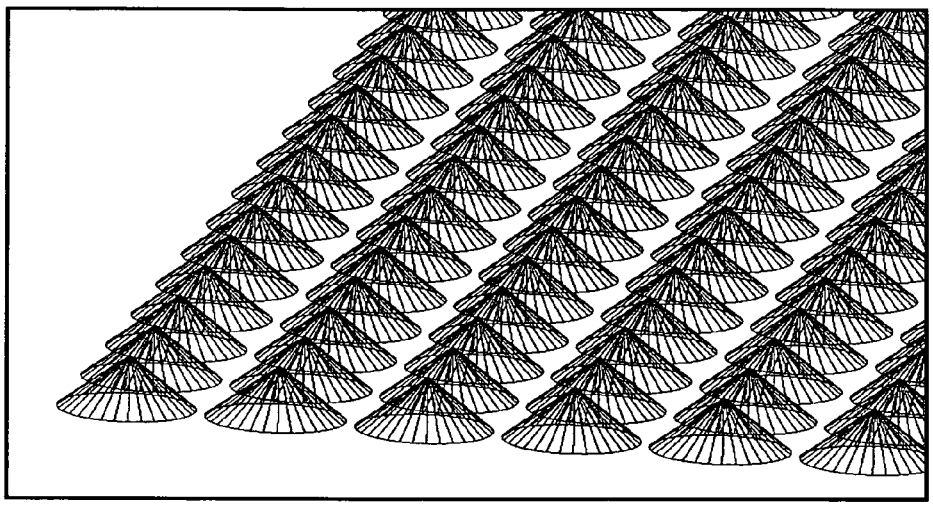
FIG. 4A~4F are top-views illustrating the molding unit surface microstructure of the light emitting diode of the embodiments.
Figure 4B:
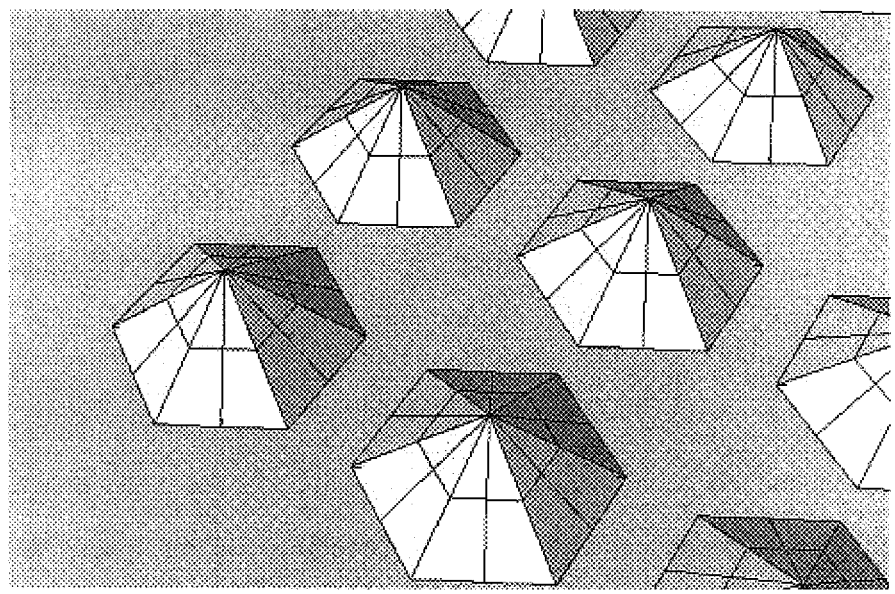
Figure 4C:
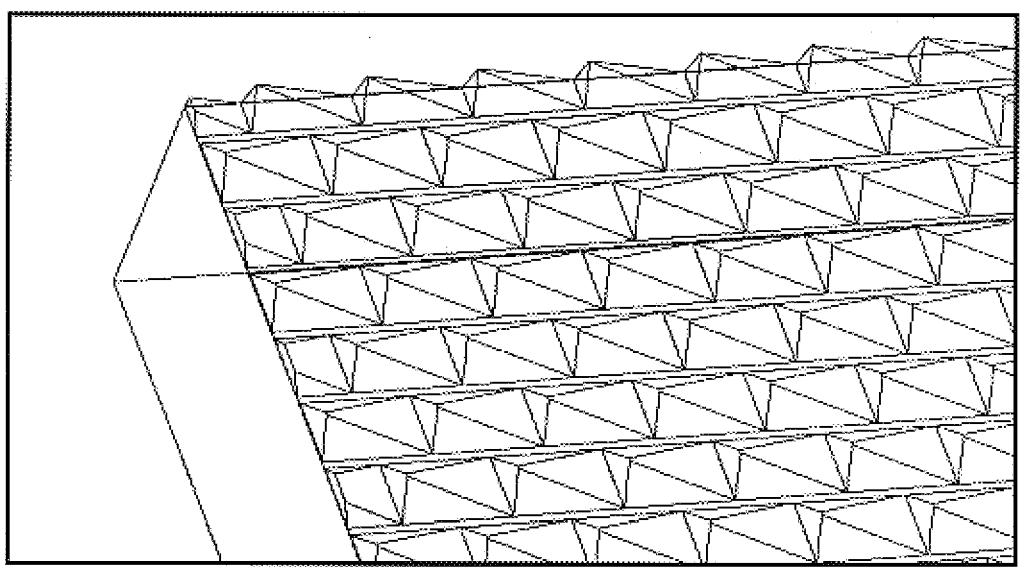
Figure 4D:
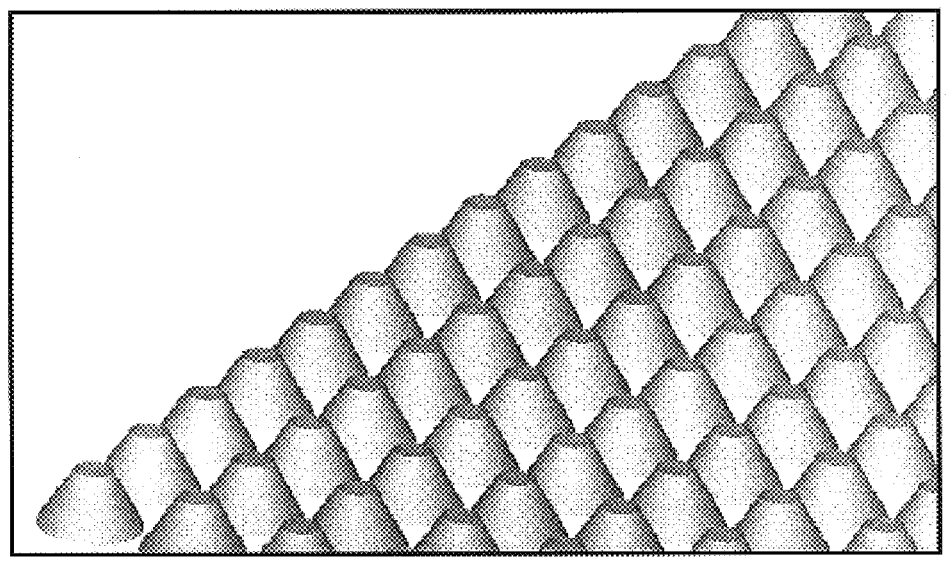

The periodic microstructure 72 of the molding unit 70 is a key feature of the invention. The microstructure comprises conical protrusions (FIG. 4A) or pyramidal protrusions. The pyramidal protrusions comprise symmetric pyramidal protrusions or asymmetric pyramidal protrusions. The symmetric pyramidal protrusions comprise a base which is symmetric triangular pyramidal, square pyramidal, symmetric pentangular pyramidal or symmetric hexangular pyramidal (FIG. 4B). The asymmetric pyramidal protrusions comprise a base which is asymmetric triangular pyramidal, asymmetric rectangular pyramidal (FIG. 4C), asymmetric pentangular pyramidal or asymmetric hexangular pyramidal.

Figure 4E:
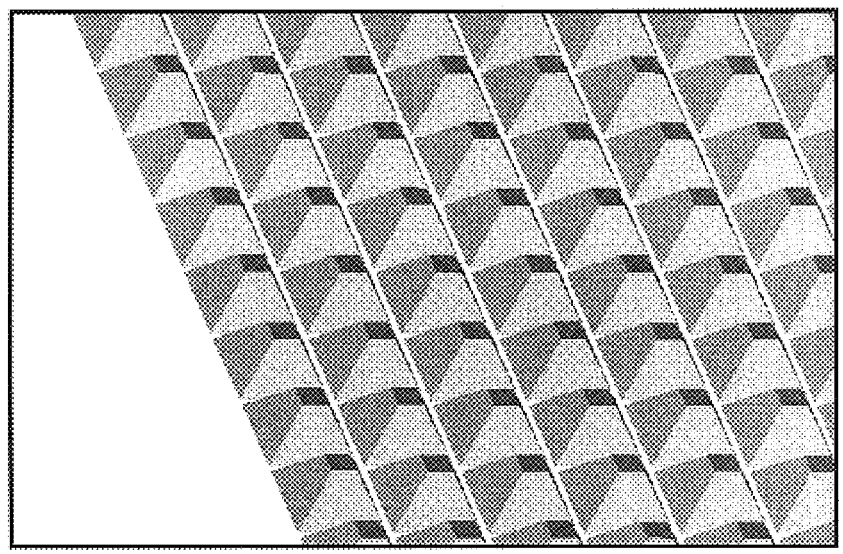

The periodic microstructure 72 of the molding unit 70 also comprises flat top conical protrusions or flat top pyramidal protrusions. The flat top pyramidal protrusions comprise flat top symmetric pyramidal protrusions or flat top asymmetric pyramidal protrusions. The flat top symmetric pyramidal protrusions comprise a base which is symmetric triangular pyramidal, square pyramidal (FIG. 4E), symmetric pentangular pyramidal or symmetric hexangular pyramidal. The flat top asymmetric pyramidal protrusions comprise a base which is asymmetric triangular pyramidal, asymmetric rectangular pyramidal, asymmetric pentangular pyramidal or asymmetric hexangular pyramidal.

Figure 4F:
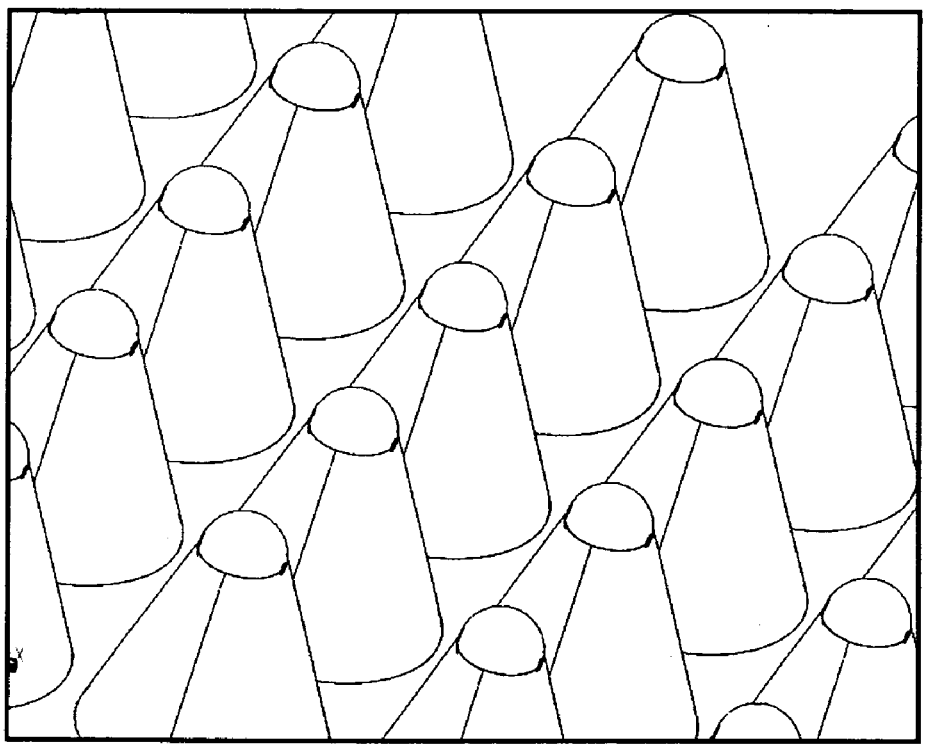

Furthermore, the periodic microstructure 72 of the molding unit 70 comprises round top conical protrusions (FIG. 4F) or round top pyramidal protrusions. The round top pyramidal protrusions comprise round top symmetric pyramidal protrusions or round top asymmetric pyramidal protrusions. The round top symmetric pyramidal protrusions comprise a base which is symmetric triangular pyramidal, square pyramidal, symmetric pentangular pyramidal or symmetric hexangular pyramidal. The round top asymmetric pyramidal protrusions comprise a base which is asymmetric triangular pyramidal, asymmetric rectangular pyramidal, asymmetric pentangular pyramidal or asymmetric hexangular pyramidal.

In one embodiment, the bottom size of a single microstructure is preferably smaller than the size of the light emitting chip for improving directionality and color-mixing. The single microstructure bottom size is about 20 um~1 nm, and preferably 20~200 um. The height of and single microstructure is about 20 um~1 mm, and preferably 20~200 um. In one embodiment, the space between the single microstructures is preferably smaller than its bottom size to make sure that the emitted light passing through the molding unit. The space of the single microstructure is about 20 um~1 nm, and preferably 20~200 um.

The following embodiments are white RGB LED. The 30 present invention is not only used as a RGB LED or a white LED, but also as a white multi-chip LED and other multi-chip LEDs.

The directionality and color-mixing are obtained from the following measurement and calculation.

Chromatic Light Beam Pattern Intensity and Chromatic Uniformity Calculation

First, the three-color light in different "space angles luminous intensity" of the RGB LED of the invention is measured to obtain the RGB LED beam pattern. The directionality of RGB LED is determined by the FMWH of the beam pattern. The smaller the FMWH is, the better directionality of the RGB LED is.

The RGB LED 1960 CIE UCS color coordinates in respective space angle are obtained form the beam pattern and 20 mA spectra data of the red, green and blue light emitting chips. The chromatic aberrations of RGB LED in each space angles are calculated according to beam pattern, and the chromatic aberration definition as follows:

$$\Delta uv = [(u-u_0)^2 - (v-v_0)^2]^{1/2}$$

wherein $(u-u_0)$ is the difference of the chromatic coordination at the RGB LED mechanical center, and $(v-v_0)$ is the difference of the chromatic coordination at each point of the RGB LED. A smaller chromatic aberration shows a higher chromatic uniformity of the device. In the invention, three space cross-sections 0°, 45° and 90° are analyzed to obtain the LED chromatic light space symmetry.

If the chromatic aberration is smaller than 0.008, it is difficult for the human eye to detect the color change. In practice, the color change must be unobvious (chromatic aberration <0.008) in ±30° space angle of LED.

First Comparative Embodiment

Figure 1:
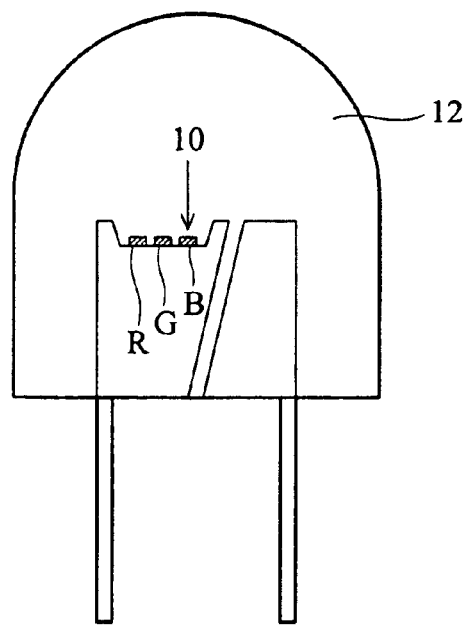
FIG. 1 is a cross-section illustrating a conventional light emitting diode.

In this embodiment, the RGB LED structure is the same as FIG. 1. The curvature radius of lens type molding unit 12 is 2.5 mm.

Figure 6A:
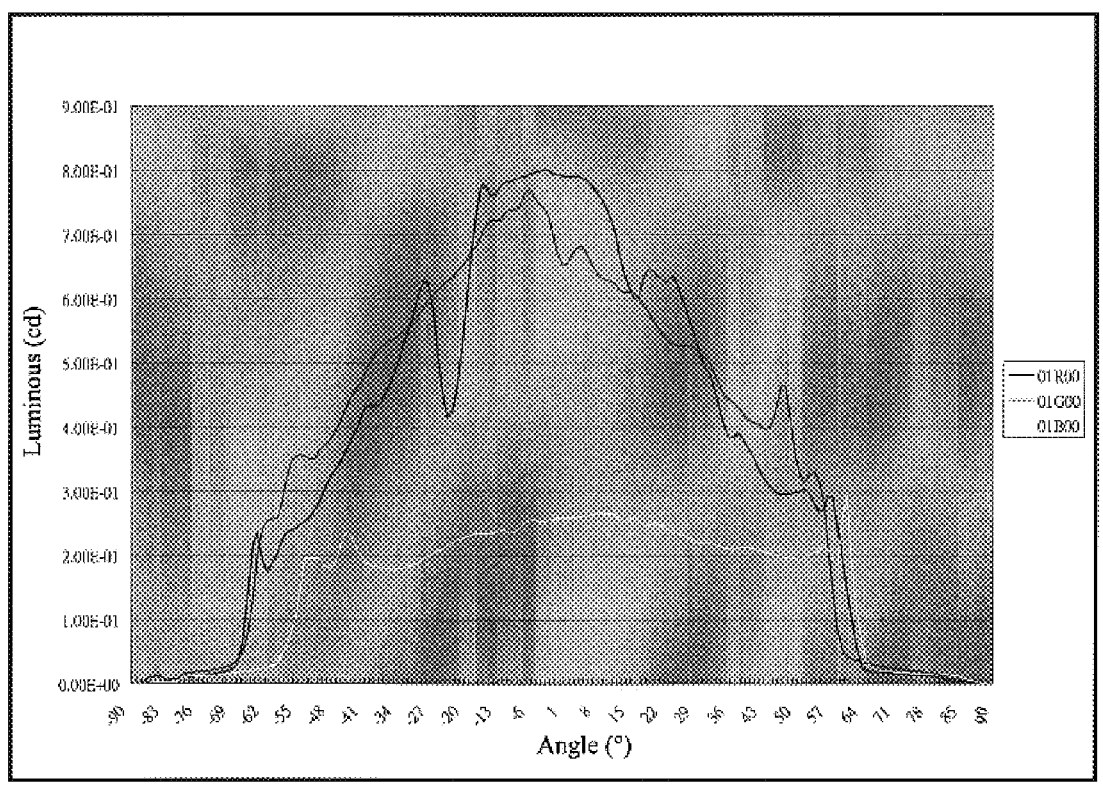
FIG. 6A is a beam pattern illustrating the directionality of a conventional light emitting diode.
Figure 6B:
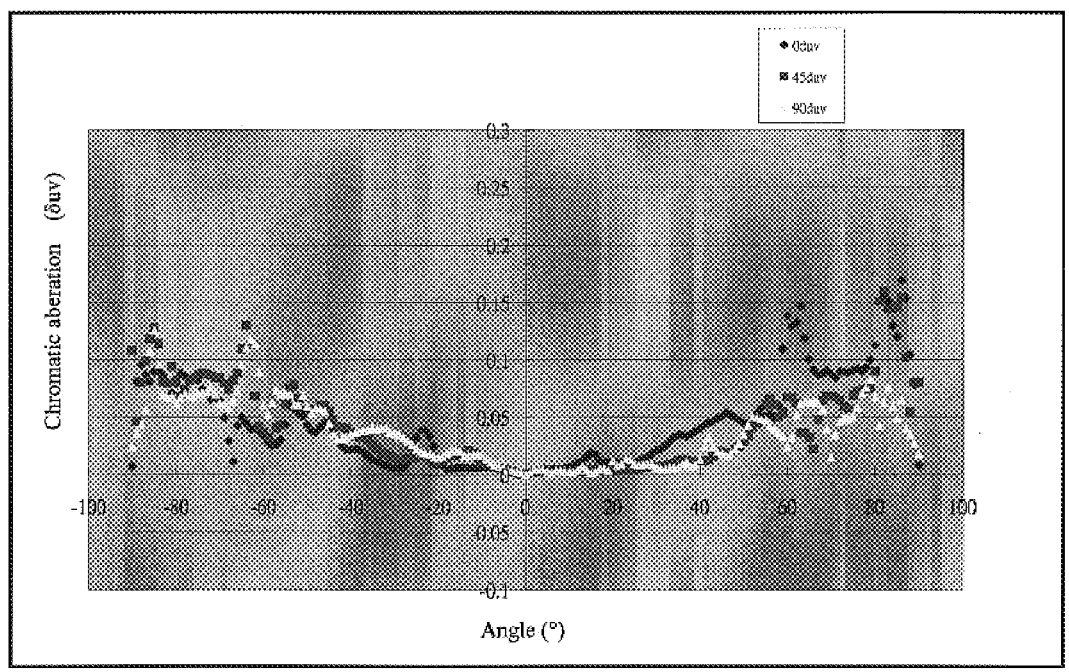
FIG. 6B is a color distribution illustrating the chromatic uniformity of a conventional light emitting diode.

The chromatic light beam pattern distribution and chromatic uniformity of the RGB LED of this embodiment are shown in FIGS. 6A and 6B.

Second Comparative Embodiment

Figure 2:
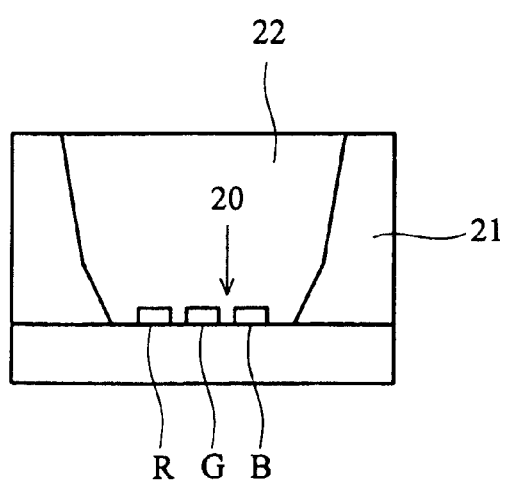
FIG. 2 is a cross-section illustrating another conventional light emitting diode.

In this embodiment, the RGB LED structure is the same as FIG. 2.

Figure 7A:
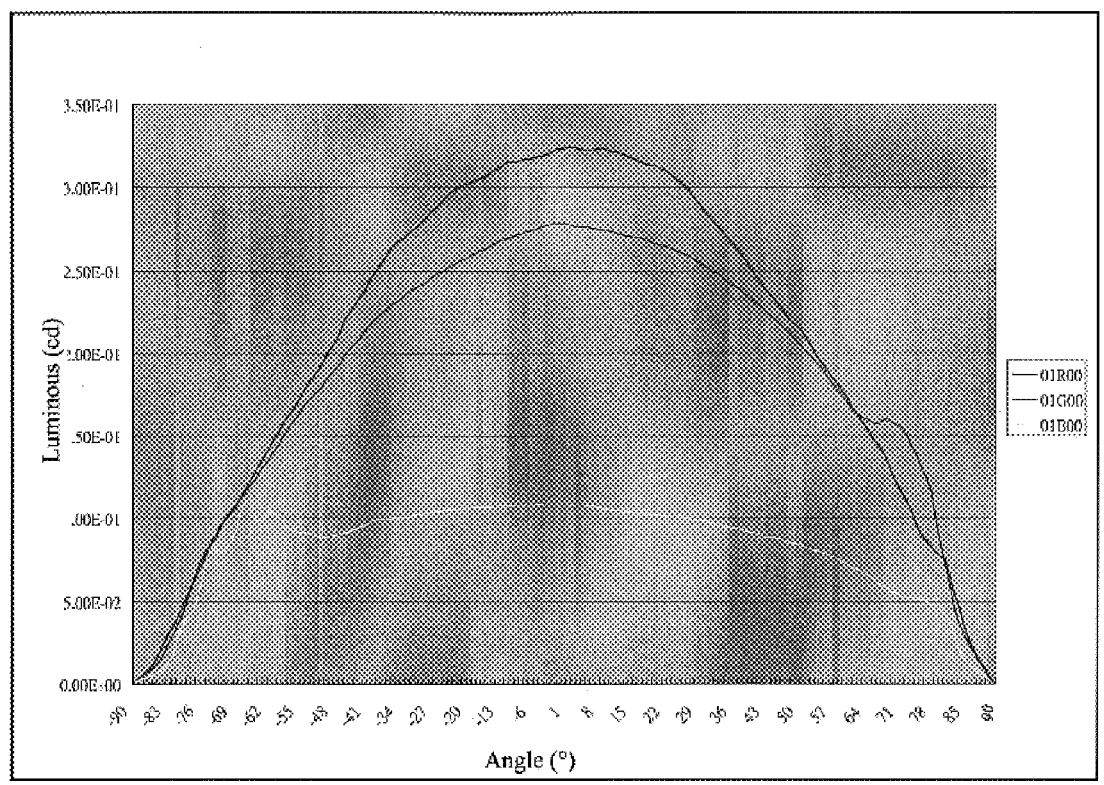
FIG. 7A is a beam pattern illustrating the directionality of another conventional light emitting diode.
Figure 7B:
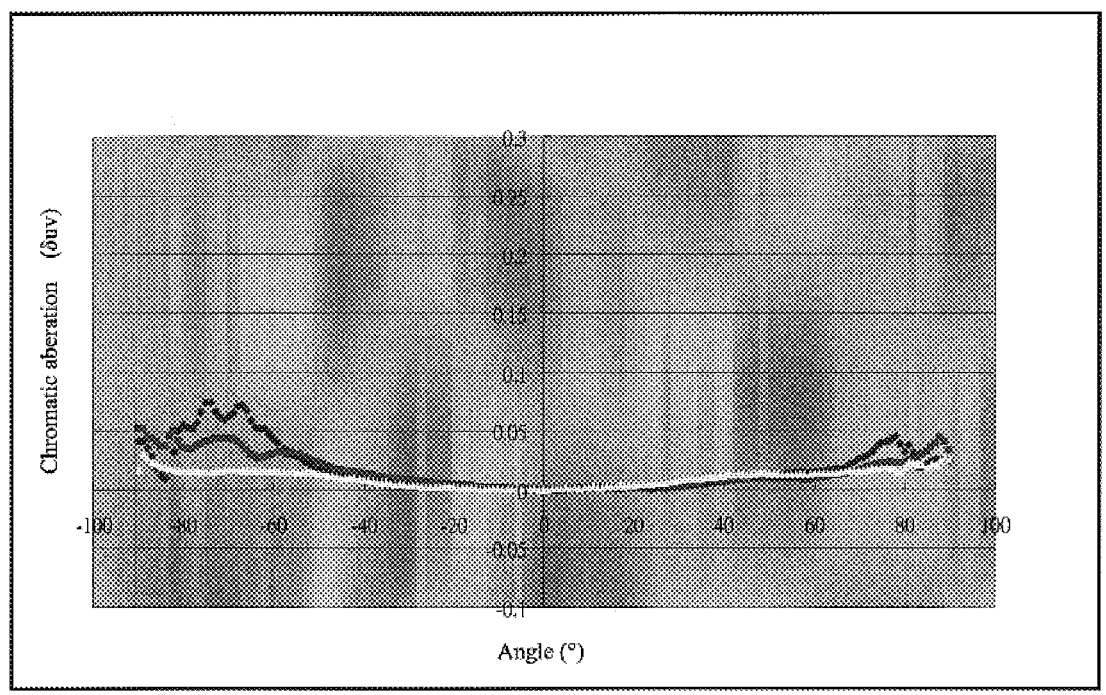
FIG. 7B is a color distribution illustrating the chromatic uniformity of another conventional light emitting diode.

The chromatic light beam pattern distribution and chromatic uniformity of the RGB LED of this embodiment are shown in FIGS. 7A and 7B.

First Embodiment

Figure 5:
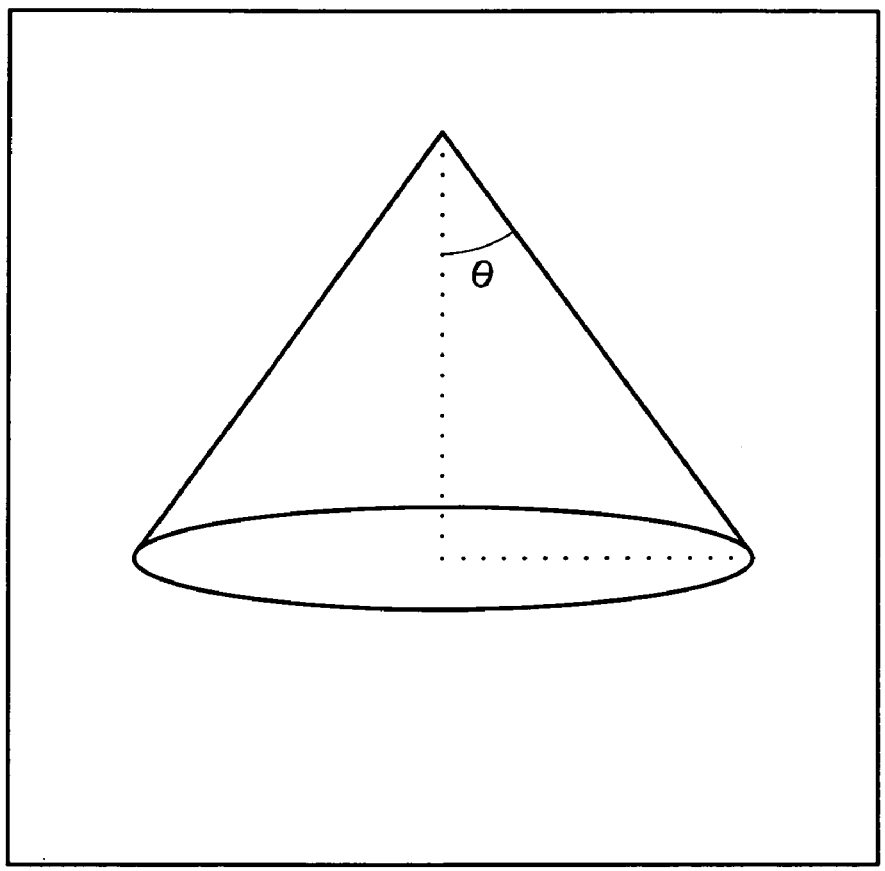
FIG. 5 is a schematic illustrating the half vertex angle of the light emitting diode.

In this embodiment, the RGB LED structure is the same as FIG. 3B. Its microstructure 72 is conical protrusions with 46° half vertex angle (FIG. 5).

Figure 8A:
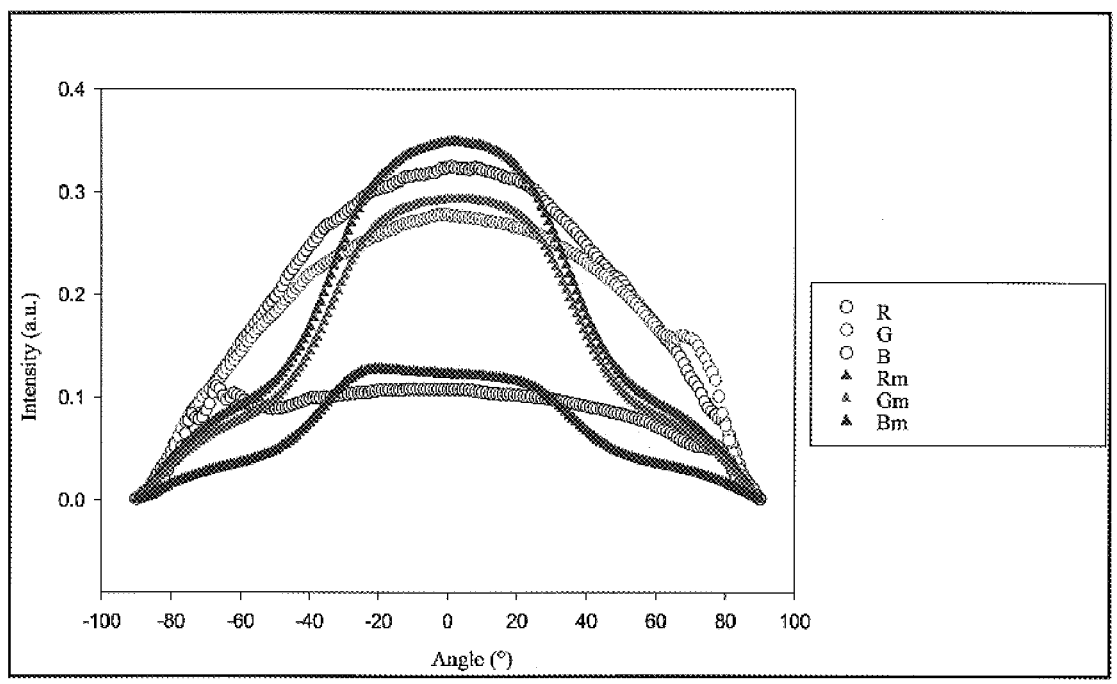
FIG. 8A is a beam pattern illustrating the directionality of a light emitting diode of the first embodiment.
Figure 8B:
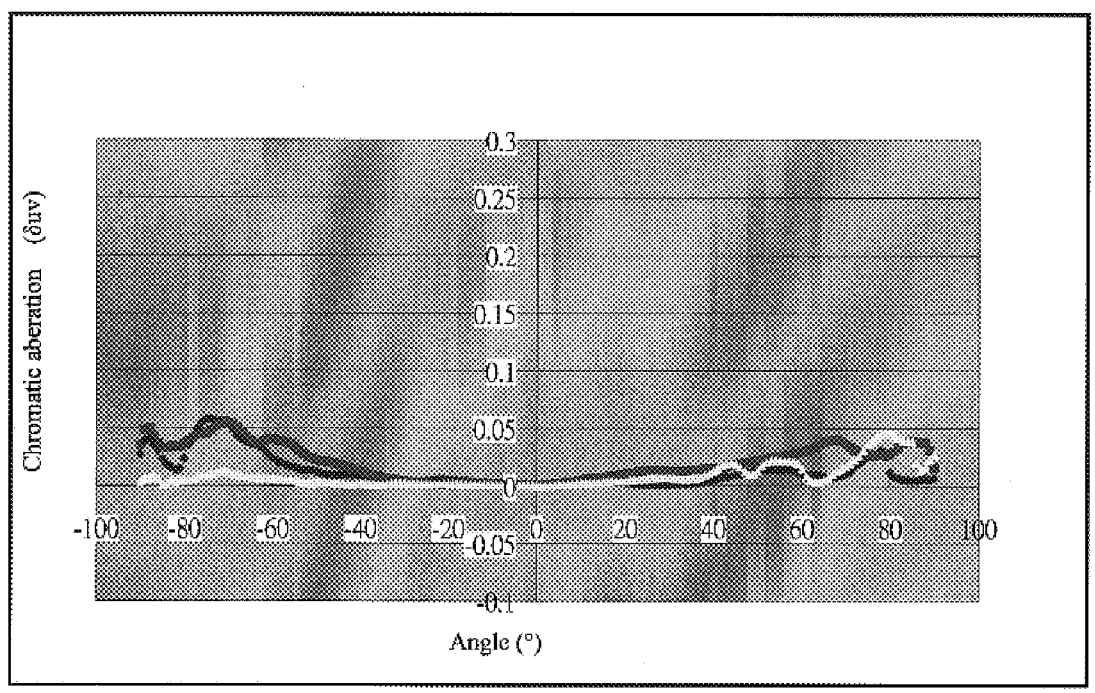
FIG. 8B is a color distribution illustrating the chromatic uniformity of a light emitting diode of the first embodiment.

The chromatic light beam pattern distribution and chromatic uniformity of the RGB LED of this embodiment are shown in FIGS. 8A and 8B.

Second Embodiment

In this embodiment, the RGB LED structures are the same as FIG. 3B. The microstructures 72 of the RGB LEDs are conical protrusions with 15°, 40°, 60° and 80° half vertex angle (FIG. 5).

Figure 9A:
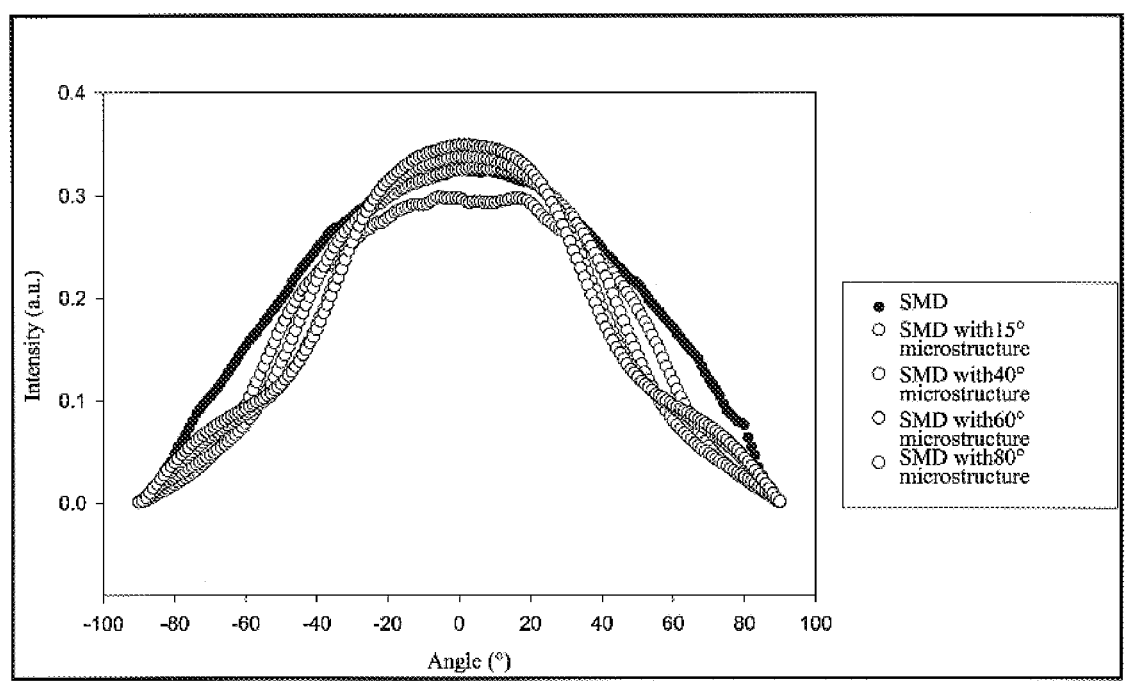
FIG. 9A is a beam pattern illustrating the directionality at a different half vertex angle of a light emitting diode microstructure of the second embodiment.
Figure 9B:
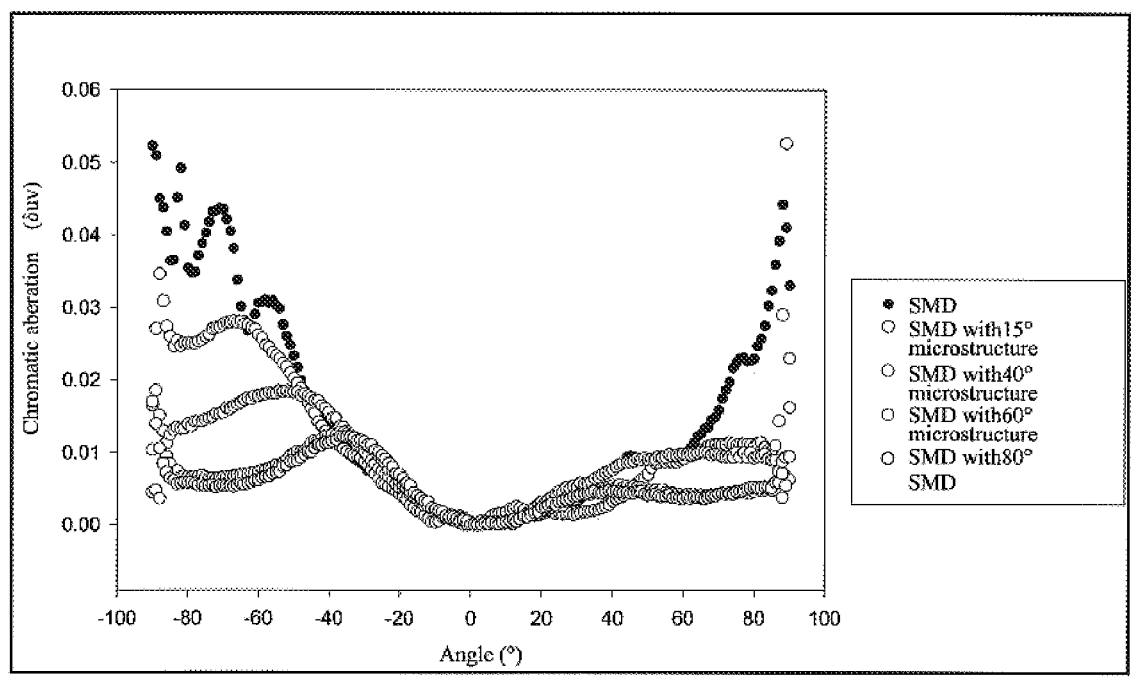
FIG. 9B is a color distribution illustrating the chromatic uniformity at a different half vertex angle of a light emitting diode microstructure of the second embodiment.

The chromatic light beam pattern distribution and chromatic uniformity of the RGB LED of this embodiment are shown in FIGS. 9A and 9B.

Third Embodiment

In this embodiment, the two RGB LED structures are the same as FIG. 3A. The microstructure 72 of the two RGB LEDs are conical protrusions with 46° half vertex angle (FIG. 5). The distance between light emitting chips of one RGB LED is 0.3 mm, another is 0.6 mm.

Figure 10:
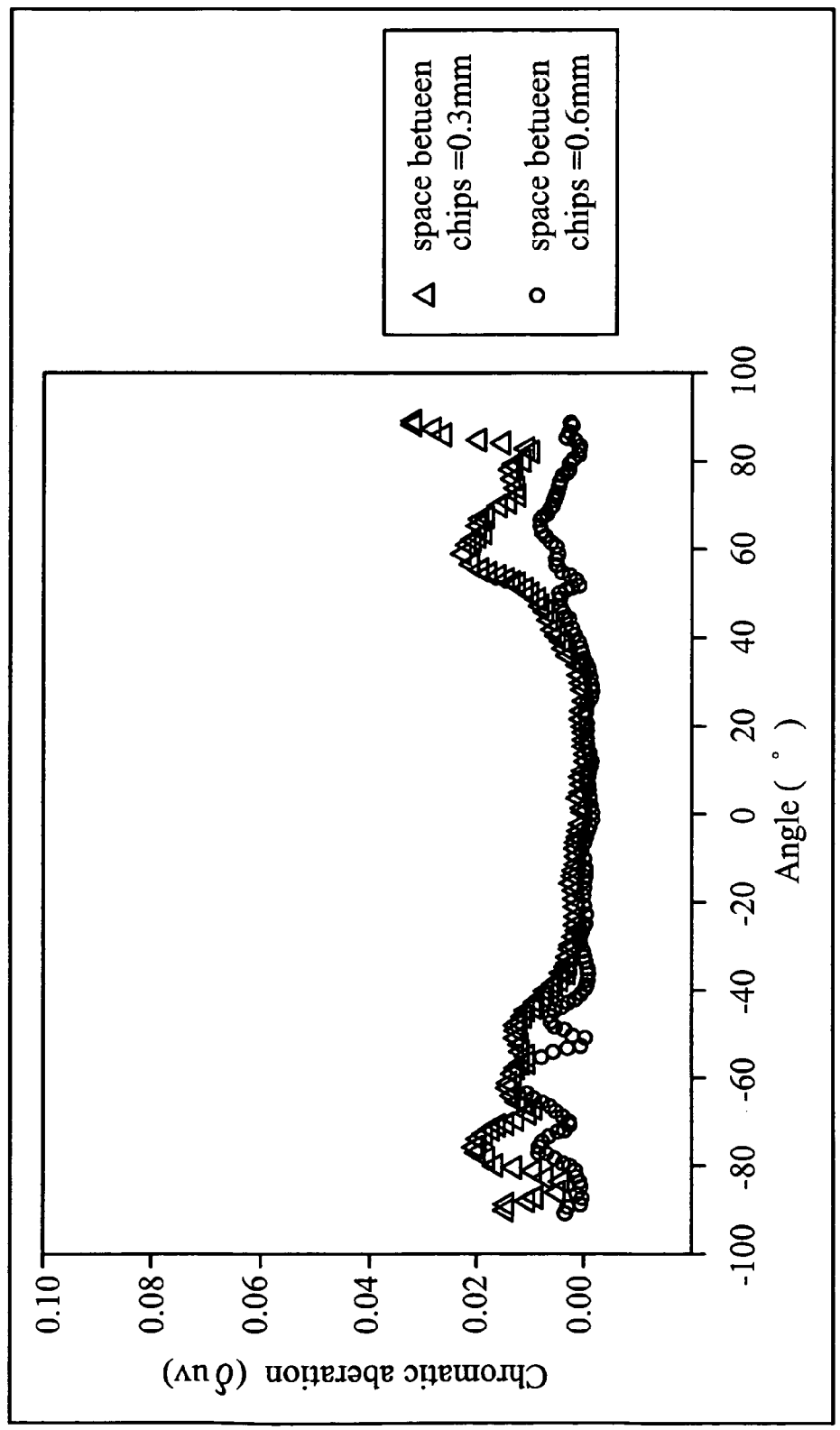
FIG. 10 is a color distribution illustrating the chromatic uniformity of different light emitting chips in a given area of a light emitting diode of the third embodiment.

The chromatic uniformity of the RGB LED of this embodiment is show in FIG. 10.

Experiment Data and Invention Effect

1. Color-Mixing Improvement

The RGB LED of the comparative embodiment 1 is a bullet type LED, and has good directionality and bad color-mixing characteristics. After using the periodic microstructure molding unit (embodiment 1), good directionality and color-mixing characteristics can obtained at the same time:

Referring to FIGS. 6A and 8A, the FMWH of the comparative embodiment 1 and embodiment 1 RGB LEDs are about ±40°. In FIGS. 6B and 8B, the chromatic aberration of RGB LED of embodiment 1 is smaller than that of comparative embodiment 1. Furthermore, the three cross-section space aberrations of RGB LED of embodiment 1 are more uniform. That shows the RGB LED of the embodiment 1 not only has better color-mixing but also with better space symmetry. Thus, the molding unit can improve the bullet type LED color-mixing characteristics.

2. Directionality Improvement

The RGB LED of the comparative embodiment 2 is SMD LED, and has bad directionality and good color-mixing characteristics. After using the periodic microstructure molding unit (embodiment 2), good directionality and color-mixing characteristics can be obtained at the same time:

Referring to FIG. 9B, the RGB LEDs of comparative embodiment 2 and embodiment 2 all have good color-mixing characteristics. In FIG. 9A, the FMHW RGB LEDs of the embodiment 2 are narrower than that of the comparative embodiment 2. That shows the RGB LEDs of embodiment 2 have better directionality. Thus, the molding unit can improve the SMD LED directionality characteristics.

3. Half Vertex Angle Influence

Referring to FIGS. 9A and 9B, different vertex angles can influence the directionality and color-mixing characteristics, and the influence can be predicted by optical simulation calculation.

4. Light Emitting Chips distance Influence

Referring to FIG. 10, different light emitting chip arrangements can influence the directionality and color-mixing characteristics, and the influence can be predicted by optical simulation calculation.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A light emitting diode, comprising:
    a lead frame;
    a plurality of light emitting chips in the lead frame; and
    a molding unit in an optical path of the light emitting chips, wherein the molding unit comprises a periodic microstructure, and the periodic microstructure comprises conical protrusions, asymmetric pyramidal protrusions or round top pyramidal protrusions.

2. The light emitting diode as claimed in claim 1 is a monochrome light emitting diode, a white light emitting diode or a full color light emitting diode.

3. The light emitting diode as claimed in claim 1, wherein the molding unit is transparent.

4. The light emitting diode as claimed in claim 1, wherein the asymmetric pyramidal protrusions comprise a base which is asymmetric triangular pyramidal, asymmetric rectangular pyramidal, asymmetric pentangular pyramidal or asymmetric hexangular pyramidal.

5. The light emitting diode as claimed in claim 1, wherein the conical protrusions comprises flat top conical protrusions.

6. The light emitting diode as claimed in claim 1, wherein the asymmetric pyramidal protrusions comprise flat top asymmetric pyramidal protrusions.

7. The light emitting diode as claimed in claim 6, wherein the flat top asymmetric pyramidal protrusion comprise a base which is asymmetric triangular pyramidal, asymmetric rectangular pyramidal asymmetric pentangular pyramidal or asymmetric hexangular pyramidal.

8. The light emitting diode as claimed in claim 1, wherein the conical protrusions comprises round top conical protrusions.

9. The light emitting diode as claimed in claim 1, wherein the round top pyramidal protrusions comprise round top symmetric pyramidal protrusions or round top asymmetric pyramidal protrusions.

10. The light emitting diode as claimed in claim 9, wherein the round top symmetric pyramidal protrusions comprise a base which is symmetric triangular pyramidal, square pyramidal, symmetric pentangular pyramidal or symmetric hexangular pyramidal; the round top asymmetric pyramidal protrusions comprise base which is asymmetric triangular pyramidal, asymmetric rectangular pyramidal, asymmetric pentangular pyramidal or asymmetric hexangular pyramidal.

11. The light emitting diode as claimed in claim 1, wherein the microstructure has a size of about 20 um~1 mm.

12. A light emitting diode fabrication method, comprising:
    providing a lead frame;
    providing a plurality of light emitting chips in the lead frame;
    patterning a surface of a molding unit to form a periodic microstructure; and
    setting the molding unit in an optical path of the light emitting chips,
    wherein the periodic microstructure comprises conical protrusions, asymmetric pyramidal protrusions or round top pyramidal protrusions.

13. The light emitting diode fabrication method as claimed in claim 12, wherein the light emitting diode is a monochrome light emitting diode, a white light emitting diode or a full color light emitting diode.

14. The light emitting diode fabrication method as claimed in claim 12, wherein the molding unit is transparent.

15. The light emitting diode fabrication method as claimed in claim 12, wherein the patterning step comprises a molding step.

16. The light emitting diode fabrication method as claimed in claim 15, wherein the molding step employs a mold having a microstructure thereon.

17. The light emitting diode fabrication method as claimed in claim 12, wherein the asymmetric pyramidal protrusions comprise a base which is asymmetric triangular pyramidal, asymmetric rectangular pyramidal, asymmetric pentangular pyramidal or asymmetric hexangular pyramidal.

18. The light emitting diode fabrication method as claimed in claim 12, wherein the conical protrusion comprises flat top conical protrusions.

19. The light emitting diode fabrication method as claimed in claim 18, wherein the asymmetric pyramidal protrusions comprise flat top asymmetric pyramidal protrusions.

20. The light emitting diode fabrication method as claimed in claim 19, wherein the flat top asymmetric pyramidal protrusions comprise a base which is asymmetric triangular pyramidal, asymmetric rectangular pyramidal, asymmetric pentangular pyramidal or asymmetric hexangular pyramidal.

21. The light emitting diode fabrication method as claimed in claim 12, wherein the conical protrusions comprises round top conical protrusions.

22. The light emitting diode fabrication method as claimed in claim 12, wherein the round top pyramidal protrusions comprise round top asymmetric pyramidal protrusions or round top asymmetric pyramidal protrusions.

23. The light emitting diode fabrication method as claimed in claim 22, wherein the round top symmetric pyramidal protrusion comprise a base which is symmetric triangular pyramidal, square pyramidal, symmetric pentangular pyramidal or symmetric hexangular pyramidal; the round top asymmetric pyramidal protrusions comprise a base which is asymmetric triangular pyramidal, asymmetric rectangular pyramidal, asymmetric pentangular pyramidal or asymmetric hexangular pyramidal.

24. The light emitting diode fabrication method as claimed in claim 12, wherein the microstructure size is smaller than the light emitting chips size.

25. The light emitting diode fabrication method as claimed in claim 12, wherein the microstructure has a size of about 20 um~1 mm.

* * * * *